United States Patent
Dewa et al.

(10) Patent No.: US 12,344,936 B2
(45) Date of Patent: Jul. 1, 2025

(54) LIQUID RAW MATERIAL SUPPLYING METHOD AND GAS SUPPLY APPARATUS

(71) Applicant: Tokyo Electron Limited, Tokyo (JP)

(72) Inventors: Hiroaki Dewa, Hokkaido (JP); Satoshi Mizunaga, Iwate (JP); Naohide Ito, Iwate (JP)

(73) Assignee: TOLYO ELECTRON LIMITED, Tokyo (JP)

( * ) Notice: Subject to any disclaimer, the term of this patent is extended or adjusted under 35 U.S.C. 154(b) by 10 days.

(21) Appl. No.: 18/244,532

(22) Filed: Sep. 11, 2023

(65) Prior Publication Data
US 2024/0093371 A1    Mar. 21, 2024

(30) Foreign Application Priority Data
Sep. 21, 2022  (JP) ................. 2022-150499

(51) Int. Cl.
  *C23C 16/448*  (2006.01)
  *C23C 16/455*  (2006.01)
  *C23C 16/52*   (2006.01)

(52) U.S. Cl.
  CPC .......... *C23C 16/52* (2013.01); *C23C 16/448* (2013.01); *C23C 16/45561* (2013.01)

(58) Field of Classification Search
  CPC .. C23C 16/52; C23C 16/448; C23C 16/45561
  See application file for complete search history.

(56) References Cited

U.S. PATENT DOCUMENTS

| 2,243,536 A * | 5/1941 | Rouan ................. B43M 11/02 137/118.01 |
| 2001/0003555 A1* | 6/2001 | Koizumi .............. F24H 9/1818 392/441 |

(Continued)

FOREIGN PATENT DOCUMENTS

| FR | 2787551 | * | 6/2000 | .............. F17C 13/02 |
| JP | 2000-133645 | * | 5/2000 | .............. H01L 21/31 |

(Continued)

OTHER PUBLICATIONS

Musa, Wibisono Wahyu, et al., "Sludge interface measurement in the storage tank utilizing neutron backscattering technique: A field experiment". Heliyon, 9 (2023) e17948 pp. 1-8.*

(Continued)

*Primary Examiner* — Bret P Chen
(74) *Attorney, Agent, or Firm* — Venjuris, P.C.

(57) ABSTRACT

Provided is a method of supplying a liquid raw material to a gas supply device. The gas supply device includes: a storage tank that stores the liquid raw material; a heating unit that heats the liquid raw material to generate a raw material gas; a level detecting unit that detects a liquid surface level of the liquid raw material stored in the storage tank; a gas inlet and a gas outlet provided in the storage tank; and a raw material inlet provided in the storage tank. The method includes: determining whether the liquid surface level of the liquid raw material is equal to or lower than a supply target level; and repeating supply of a specified amount of liquid raw material to the storage tank a specified number of times when the liquid surface level of the liquid raw material is equal to or lower than the supply target level.

10 Claims, 2 Drawing Sheets

(56) References Cited

U.S. PATENT DOCUMENTS

| | | | | |
|---|---|---|---|---|
| 2002/0124646 A1* | 9/2002 | Mokuo | ............ | H01L 21/67057 |
| | | | | 73/299 |
| 2007/0261735 A1* | 11/2007 | Yasumuro | ........... | G01F 23/2968 |
| | | | | 137/154 |
| 2010/0295562 A1* | 11/2010 | Fuetterer | .............. | B41J 2/17566 |
| | | | | 347/7 |
| 2018/0049345 A1* | 2/2018 | Huang | .................... | G01F 23/38 |
| 2018/0291502 A1* | 10/2018 | Kitagawa | ............ | C23C 16/4412 |

FOREIGN PATENT DOCUMENTS

| | | | | | |
|---|---|---|---|---|---|
| JP | 2000-241227 | * | 9/2000 | ............ | G01F 23/14 |
| JP | 2010-155415 | * | 7/2010 | ................ | B41J 2/01 |
| JP | 2014-007289 A | | 1/2014 | | |
| WO | WO 03/035927 A2 * | | 5/2003 | ............. | C23C 16/00 |
| WO | WO 2014/112022 A1 * | | 7/2014 | ................ | C02F 1/04 |
| WO | WO 2015/107567 A1 * | | 7/2015 | ................ | F94B 9/02 |

OTHER PUBLICATIONS

Maslar, James E., et al., "Apparatus for Characterizing Gas-Phase Chemical Precursor Delivery for Thin Film Deposition Processes". Journal of Research of the National Institute of Standards and Technology, vol. 124, Article No. 124005 (2019) pp. 1-15.*

\* cited by examiner

LIQUID RAW MATERIAL SUPPLYING METHOD AND GAS SUPPLY APPARATUS

CROSS-REFERENCE TO RELATED APPLICATIONS

The present application is based on and claims priority from Japanese Patent Application No. 2022-150499, filed on Sep. 21, 2022, with the Japan Patent Office, the disclosure of which is incorporated herein in its entirety by reference.

TECHNICAL FIELD

The present disclosure relates to a supplying method of a liquid type raw material and a gas supply apparatus.

BACKGROUND

Japanese Patent Application Laid-open No. 2014-007289 discloses a film forming apparatus that has a gas supply apparatus by which a raw material gas generated by heating a liquid raw material is supplied to a processing container.

SUMMARY

According to an aspect, provided is a method of supplying a liquid raw material to a gas supply apparatus. The gas supply apparatus includes: a raw material storage tank that stores the liquid raw material; a heating unit that heats the liquid raw material stored in the raw material storage tank to generate a raw material gas; a liquid surface level detecting unit that detects a liquid surface level of the liquid raw material stored in the raw material storage tank; a gas inlet provided in the raw material storage tank and connected to a carrier gas supply that supplies a carrier gas to the raw material storage tank, the carrier gas carrying the raw material gas; a gas outlet provided in the raw material storage tank and connected to a gas outflow section that allows the raw material gas to flow out from the raw material storage tank together with the carrier gas; and a raw material inlet provided in the raw material storage tank, and connected to a liquid raw material supply that supplies the liquid raw material to the raw material storage tank. The liquid raw material supplying method includes: determining whether the liquid surface level of the liquid raw material detected by the liquid surface level detecting unit is equal to or lower than a supply target level; and repeating supply of a specified amount of the liquid raw material to the raw material storage tank a specified number of times when the liquid surface level of the liquid raw material is equal to or lower than the supply target level.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
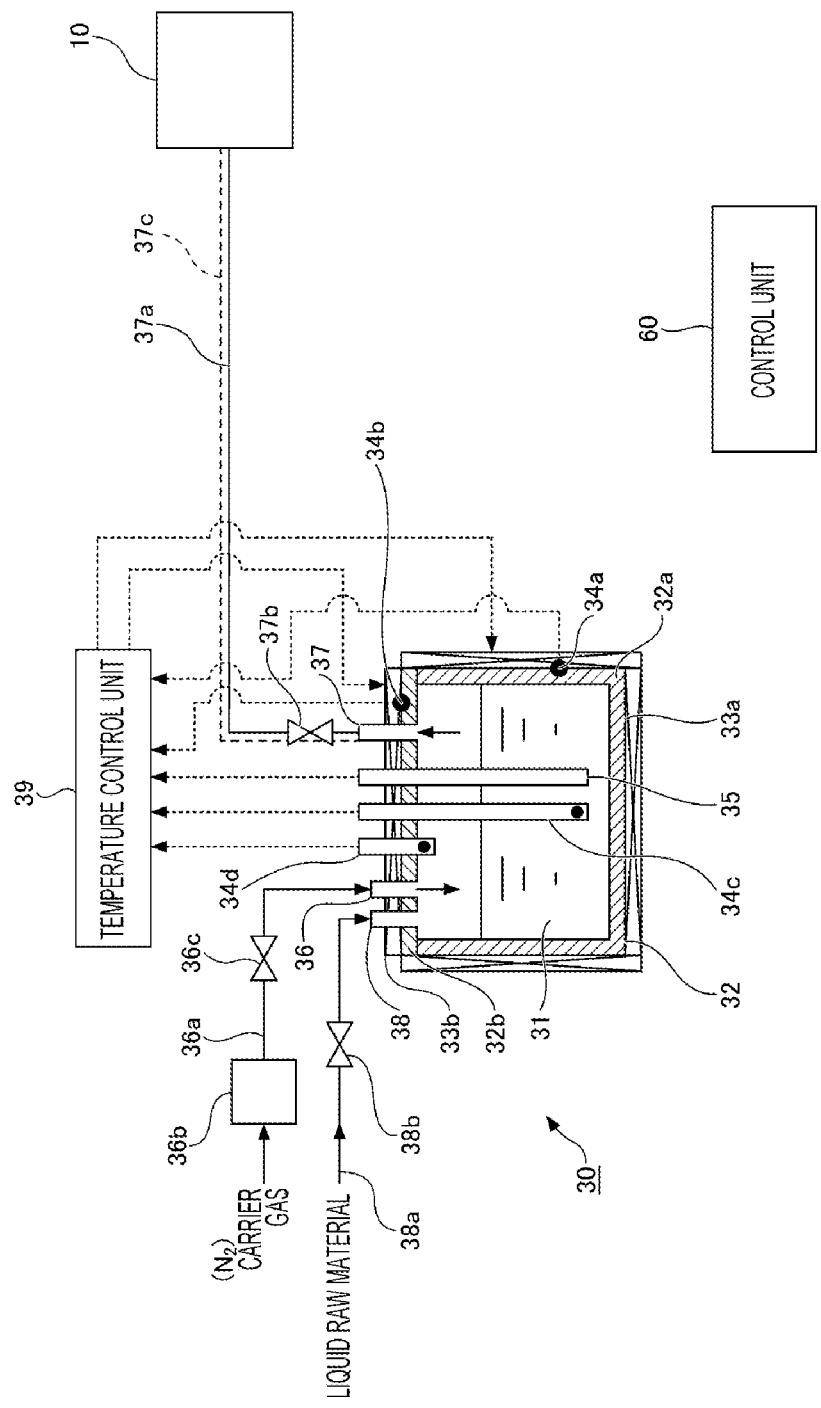
FIG. 1 is a schematic view illustrating a configuration example of a gas supply apparatus.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to drawings. In the drawings, the same components are denoted by the same reference numerals, and redundant descriptions thereof may be omitted in some cases.

[Gas Supply Apparatus]

The configuration of a gas supply apparatus 30 according to the present exemplary embodiment will be described by using FIG. 1. FIG. 1 is a schematic view illustrating a configuration example of the gas supply apparatus 30.

The gas supply apparatus 30 is an apparatus by which a raw material gas generated by heating a liquid raw material 31 is supplied to a processing container 10 of a substrate processing apparatus, together with a carrier gas. The substrate processing apparatus uses a gas supplied from the gas supply apparatus 30 to perform desired processing (for example, film formation processing) on a substrate within the processing container 10. The substrate processing apparatus having the processing container 10 is, for example, a film forming apparatus, and may be a semi-batch type film forming apparatus, in which a plurality of substrates disposed on a rotary table within the processing container 10 is rotated by the rotation of the rotary table, and the substrates sequentially pass through a region to which a first gas (e.g., a raw material gas supplied from the gas supply apparatus 30) is supplied, and a region to which a second gas (e.g., a reactive gas that forms a desired film on the surface of the substrate by reacting with the raw material gas) is supplied, and are subjected to film formation processing. The substrate processing apparatus having the processing container 10 is not limited to the semi-batch type film forming apparatus, and may be, for example, a batch type film forming apparatus that processes a plurality of substrates within the processing container 10 at once, a single-sheet type film forming apparatus that processes the substrates one by one, or a multi-sheet type film forming apparatus that includes a plurality of stages in the processing container 10.

For the liquid raw material 31, it is possible to use, for example, a raw material containing at least one of various metals such as aluminum (Al), hafnium (Hf), zirconium (Zr), and titanium (Ti), or a raw material containing silicon (Si). As the carrier gas, an inert gas such as nitrogen ($N_2$) gas, or noble gas (Ar, He) may be used.

The gas supply apparatus 30 has a raw material storage tank 32 that stores the liquid raw material 31. The raw material storage tank 32 is also called an ampule or a reservoir. The raw material storage tank 32 has a tank body 32a formed into a bottomed cylinder, and a ceiling lid 32b that airtightly covers the ceiling of the tank body 32a. The tank body 32a and the ceiling lid 32b are made of, for example, a metal material such as stainless steel. The capacity of the raw material storage tank 32 is set to, for example, about 1 to 10 liters. The lower portion within the raw material storage tank 32 becomes a liquid phase portion where the liquid raw material 31 is accumulated. The upper portion within the raw material storage tank 32 becomes a gas phase portion where the raw material gas is accumulated. The size of the gas phase portion increases or decreases as the liquid surface level of the liquid raw material 31 is vertically moved. That is, the size of the gas phase portion increases as the liquid surface level of the liquid raw material 31 lowers, and the size of the gas phase portion decreases as the liquid surface level of the liquid raw material 31 rises.

The gas supply apparatus 30 has heating units (a main heating unit 33a and a ceiling heating unit 33b) which heat the liquid raw material 31 stored in the raw material storage tank 32 to generate the raw material gas. Specifically, the gas supply apparatus 30 includes the main heating unit 33a that heats the bottom and side portions of the raw material storage tank 32 to generate the raw material gas, and the ceiling heating unit 33b that heats the ceiling of the raw material storage tank 32. Specifically, the main heating unit 33a is provided so as to surround and cover substantially the entire outer peripheral surface of the bottom and side portions of the tank body 32a. The ceiling heating unit 33b is provided so as to cover substantially the entire top surface of the ceiling lid 32b. The main heating unit 33a may be provided in a part of the tank body 32a. The ceiling heating unit 33b may be provided in a part of the ceiling lid 32b.

The gas supply apparatus 30 includes a main temperature measurement unit 34a, a ceiling temperature measurement unit 34b, a liquid phase temperature measurement unit 34c, a gas phase temperature measurement unit 34d, a level sensor 35, a temperature control unit 39, and a control unit 60.

The main temperature measurement unit 34a measures the temperature of a portion where the main heating unit 33a is provided. The main temperature measurement unit 34a has, for example, a thermocouple. The thermocouple is attached to the outer peripheral surface of the lower portion of the tank body 32a, and measures the temperature of the tank body 32a. The attachment position of the thermocouple is preferably located below the vertically moving liquid surface level, and the thermocouple may be attached to, for example, the lower surface of the bottom of the tank body 32a. A detection signal of the main temperature measurement unit 34a is sent to the temperature control unit 39.

The ceiling temperature measurement unit 34b measures the temperature of a portion where the ceiling heating unit 33b is provided. The ceiling temperature measurement unit 34b has, for example, a thermocouple. The thermocouple is attached to the top surface of the ceiling lid 32b, and measures the temperature of the ceiling lid 32b. A detection signal of the ceiling temperature measurement unit 34b is sent to the temperature control unit 39.

The liquid phase temperature measurement unit 34c measures the temperature of the liquid raw material 31. The liquid phase temperature measurement unit 34c has, for example, a hermetically-sealed elongated hollow sensor tube made of a metal, and a thermocouple provided at the lower end inside the sensor tube. The sensor tube is attached so as to extend downwards through the ceiling lid 32b, and its tip is provided at a position where the liquid raw material 31 is always present. Accordingly, the thermocouple measures the temperature of the liquid raw material 31. A detection signal of the gas phase temperature measurement unit 34d is sent to the temperature control unit 39.

The gas phase temperature measurement unit 34d measures the temperature of the gas phase portion at the upper portion within the raw material storage tank 32. The gas phase temperature measurement unit 34d has, for example, a hermetically-sealed elongated hollow sensor tube made of a metal, and a thermocouple provided at the lower end inside the sensor tube. The sensor tube is attached so as to extend downwards through the ceiling lid 32b, and its tip is provided at a position where the raw material gas is always present. Accordingly, the thermocouple measures the temperature of the raw material gas in the gas phase portion. A detection signal of the gas phase temperature measurement unit 34d is sent to the temperature control unit 39.

The level sensor (liquid surface level detecting unit) 35 detects the liquid surface level of the liquid raw material 31 stored in the raw material storage tank 32. The level sensor 35 has, for example, a rod-shaped level measuring body that is attached so as to extend into the raw material storage tank 32 through the ceiling lid 32b, and has one or more detection sensors that detect the presence or absence of the liquid raw material 31 in the longitudinal direction (height direction) of the level measuring body. Among one or more detection sensors, at least one detection sensor is provided at a position that corresponds to a target level of the liquid surface level of the liquid raw material 31 when the liquid raw material is supplied to the raw material storage tank 32 (hereinafter, also referred to as a supply target level). When the liquid surface level of the liquid raw material 31 reaches or exceeds the position of the detection sensor of the level sensor 35 (the supply target level), the level sensor 35 is in an ON state. When the liquid surface level of the liquid raw material 31 is below the position of the detection sensor of the level sensor 35 (the supply target level), the level sensor 35 is in an OFF state. A detection signal of the level sensor 35 is sent to the temperature control unit 39 and the control unit 60.

The liquid surface level detecting unit is not limited to this configuration, and may be configured to detect the liquid surface level of the liquid raw material 31 in a stepless manner. For example, it is possible to use a liquid surface level sensor that outputs ultrasonic waves, detects ultrasonic waves reflected by the liquid surface of the liquid raw material 31, and detects the liquid surface level of the liquid raw material 31 in a stepless manner.

The temperature control unit 39 controls the main heating unit 33a and the ceiling heating unit 33b on the basis of the temperatures detected by various temperature measurement units (the main temperature measurement unit 34a, the ceiling temperature measurement unit 34b, the liquid phase temperature measurement unit 34c, and the gas phase temperature measurement unit 34d), and the detection signal of the level sensor 35. Accordingly, the liquid raw material 31 is heated to a temperature (e.g., about 80 to 160° C.) at which the heated liquid raw material is vaporized so as to generate the raw material gas, within a temperature range where the liquid raw material itself is not thermally decomposed.

A gas inlet 36, a gas outlet 37, and a raw material inlet 38 are provided in the ceiling lid 32b of the raw material storage tank 32.

The gas inlet 36 is connected to a carrier gas supply that supplies a carrier gas to the raw material storage tank 32. The carrier gas carries the raw material gas. The carrier gas supply has a carrier gas supply source (not illustrated), a carrier gas flow path 36a, and a flow rate control unit 36b and an open/close valve 36c interposed in the carrier gas flow path 36a. One end of the carrier gas flow path 36a is connected to the carrier gas supply source (not illustrated), and the other end is connected to the gas inlet 36.

The gas outlet 37 is connected to a gas outflow section that allows the raw material gas to flow out from the raw material storage tank 32 together with the carrier gas. The gas outflow section has a gas flow path 37a, an open/close valve 37b interposed in the gas flow path 37a, and a flow path heater 37c provided in the gas flow path 37a. One end of the gas flow path 37a is connected to the gas outlet 37, and the other end is connected to the processing container 10. The control unit 60 opens the open/close valves 36c and 37b and controls the flow rate control unit 36b so that the carrier gas whose flow rate is controlled may be supplied to the raw material storage tank 32. The carrier gas whose flow rate is controlled is supplied into the raw material storage tank 32 through the gas inlet 36, so that the saturated raw material gas flows out from the gas outlet 37 to the gas flow path 37a together with the carrier gas. Then, the raw material gas carried together with the carrier gas is supplied into the processing container 10. The control unit 60 may stop the supply of the raw material gas into the processing container 10 by closing at least one of the open/close valves 36c and 37b. For example, in the gas flow path 37a, the flow path heater 37c such as a tape heater is provided along the gas flow path 37a so as to heat the gas flow path 37a to, for example, about 85 to 165° C. and to prevent the raw material gas from being liquefied.

A liquid raw material supply that supplies the liquid raw material to the raw material storage tank 32 is connected to the raw material inlet 38. The liquid raw material supply has a liquid raw material supply source (not illustrated), a liquid raw material flow path 38a, and an open/close valve 38b interposed in the liquid raw material flow path 38a. One end of the liquid raw material flow path 38a is connected to the liquid raw material supply source (not illustrated), and the other end is connected to the raw material inlet 38. The control unit 60 may supply the liquid raw material to the raw material storage tank 32 by opening the open/close valve 38b. The control unit 60 may stop the supply of the liquid raw material into the raw material storage tank 32 by closing the open/close valve 38b.

The control unit 60 may be, for example, a computer, etc. A computer program that operates each unit of the gas supply apparatus 30 is stored in a storage medium. The storage medium may be, for example, a flexible disk, a compact disc, a hard disk, a flash memory, a DVD, etc.

Figure 2:
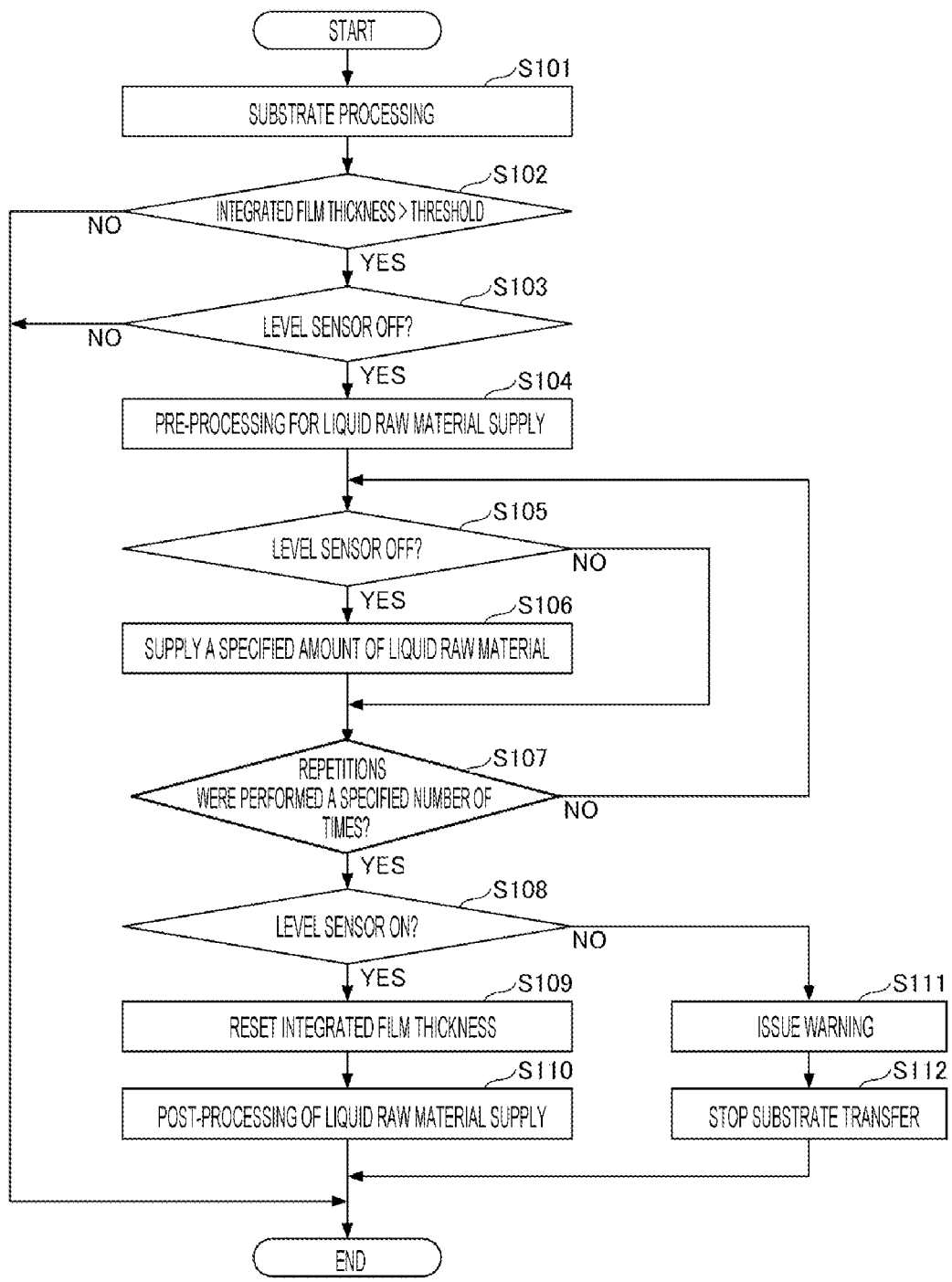
FIG. 2 is a flow chart illustrating an example of a supply process of a liquid raw material supplying a liquid raw material to a raw material storage tank.

Next, descriptions will be made on a liquid raw material supplying method of supplying a liquid raw material to the raw material storage tank 32, by using FIG. 2. FIG. 2 is a flow chart illustrating an example of a liquid raw material supply process of supplying a liquid raw material to the raw material storage tank 32.

In step S101, the control unit 60 performs substrate processing (film formation processing) on a substrate within the processing container 10. Here, a raw material gas obtained by vaporizing a liquid raw material is supplied into the processing container 10, and film formation processing is performed on the substrate. At this time, the control unit 60 stores an integrated value of the films formed on the substrates (integrated film thickness). The amount of the films formed in one film formation process falls within a range of, for example, 0.1 nm to 9999 nm. Here, the integrated value film thickness is obtained by acquiring how much film thicknesses were applied to the substrate during the film formation processing based on a recipe, and then integrating (accumulating) the acquired film thicknesses. After the film formation processing on substrates in the same lot is ended, the processing of the control unit 60 proceeds to step S102.

In step S102, the control unit 60 determines whether the integrated film thickness is larger than a threshold. Here, the threshold is a threshold for determining whether to execute the supply of the liquid raw material into the raw material storage tank 32. When the integrated film thickness is larger than a threshold (S102. YES), the processing of the control unit 60 proceeds to step S103. Meanwhile, when the integrated film thickness is not larger than a threshold (S102. NO), the liquid raw material supply process illustrated in FIG. 2 is ended. That is, the processing of the control unit 60 is returned to step S101, and the substrate processing apparatus performs film formation processing on substrates of the next lot.

In step S103, the control unit 60 determines whether the state of the level sensor 35 is an OFF state. That is, it is determined whether the liquid surface level of the liquid raw material 31 is lower than the position of the detection sensor of the level sensor 35 (supply target level). When the state of the level sensor 35 is an OFF state (S103. YES), the processing of the control unit 60 proceeds to step S104. Meanwhile, when the state of the level sensor 35 is not an OFF state (S103.1•10), the liquid raw material supply process illustrated in FIG. 2 is ended. That is, the processing of the control unit 60 is returned to step S101, and the substrate processing apparatus performs film formation processing on substrates of the next lot.

In step S104, the control unit 60 performs pre-processing before the liquid raw material is supplied to the raw material storage tank 32 (pre-processing for liquid raw material supply).

In step S105, the control unit 60 determines whether the state of the level sensor 35 is an OFF state. That is, it is determined whether the liquid surface level of the liquid raw material 31 is lower than the position of the detection sensor of the level sensor 35 (supply target level). When the state of the level sensor 35 is an OFF state (S105. YES), the processing of the control unit 60 proceeds to step S106. Meanwhile, when the state of the level sensor 35 is not an OFF state (S105. NO), the processing of the control unit 60 proceeds to step S107.

In step S106, the control unit 60 opens the open/close valve 38b, and supplies a predetermined amount (specified amount) of liquid raw material to the raw material storage tank 32. When a predetermined amount of liquid raw material is supplied, the control unit 60 closes the open/close valve 38b. Then, the processing of the control unit 60 proceeds to step S107. The predetermined amount preferably falls within a range of, for example, 0.1 to 10 times the raw material used for one film formation process.

In step S107, the control unit 60 determines whether the determination of step S105 has been repeated a specified number of times. The specified number of times is preferably within a range of, for example, 1 to 100 times. When the number of repetitions has not reached the specified number of times (S107. NO), the processing of the control unit 60 is returned to step S105. Meanwhile, when the number of repetitions has reached the specified number of times (S107. YES), the processing of the control unit 60 proceeds to step S108.

In step S108, the control unit 60 determines whether the state of the level sensor 35 is an ON state. That is, it is determined whether the liquid surface level of the liquid raw material 31 has reached or exceeded the position of the detection sensor of the level sensor 35 (supply target level). When the state of the level sensor 35 is an ON state (S108. YES), the processing of the control unit 60 proceeds to step S109. In step S109, the control unit 60 resets the integrated film thickness. Then, in step S110, the control unit 60 performs post-processing after the liquid raw material is supplied to the raw material storage tank 32 (post-processing of liquid raw material supply). The post-processing is processing of preparing the supply of the raw material gas into the processing container 10. Then, when the post-processing is ended, the liquid raw material supply process illustrated in FIG. 2 is ended. That is, the processing of the control unit 60 is returned to step S101, and the substrate processing apparatus performs film formation processing on substrates of the next lot.

Meanwhile, when the state of the level sensor 35 is not an ON state (S108. NO), the processing of the control unit 60 proceeds to step S111. In step S111, the control unit 60 assumes that the liquid surface level of the liquid raw material 31 within the raw material storage tank 32 has not reached the predetermined supply target level, and issues a warning. Then, in step S112, the control unit 60 stops the transfer of substrates to the processing container 10. Then, the liquid raw material supply process illustrated in FIG. 2 is ended. In this case, substrates of the next lot are not transported to the substrate processing apparatus, and the next film formation processing is not performed.

As above, according to the liquid raw material supply process illustrated in FIG. 2, in the supply of the liquid raw material to the raw material storage tank 32, as illustrated in FIG. 2, when the state of the level sensor 35 is an OFF state, the processing of supplying a predetermined amount of liquid raw material to the raw material storage tank 32 is repeated. Accordingly, the liquid surface level of the liquid raw material 31 within the raw material storage tank 32 may be controlled with high accuracy. In other words, the size of the gas phase portion where the raw material gas is accumulated in the raw material storage tank 32 may be controlled with high accuracy. Accordingly, when the substrate processing apparatus performs film formation processing on substrates, the flow rate of the raw material gas supplied from the gas supply apparatus 30 into the processing container 10 (partial pressures of the raw material gas and the carrier gas) may be controlled with high accuracy. Therefore, it is possible to suppress variations in the film thickness of the film formed on the substrate (film thickness shift).

Further, by repeating the processing of supplying a predetermined amount of liquid raw material to the raw material storage tank 32, it is possible to suppress variations in the temperature of the liquid raw material 31 within the raw material storage tank 32. Accordingly, the generation amount of the raw material gas generated from the heated liquid raw material 31 may be stabilized. Further, it is possible to suppress variations in the temperature of the raw material gas in the gas phase portion. Accordingly, it is possible to suppress the temperature-dependent variations in the amount of saturated vapor.

Further, the processing in step S105 to step S106 is repeated a specified number of times. Accordingly, for example, even when waves are generated on the liquid surface of the liquid raw material 31 through the supply of the liquid raw material into the raw material storage tank 32 and thus the ON-state determination is made by the level sensor 35, it is possible to determine whether the level sensor 35 is in an OFF state again in the next and subsequent cycles. Accordingly, for example, even when the ON-state determination is made by the level sensor 35 due to generation of waves on the liquid surface of the liquid raw material 31, when it is determined that the level sensor 35 is in an OFF state as the waves on the liquid surface are reduced, it is possible to supply a predetermined amount of liquid raw material. Accordingly, the liquid surface level of the liquid raw material 31 within the raw material storage tank 32 may be controlled with high accuracy.

As illustrated in FIG. 2, the liquid raw material is supplied to the raw material storage tank 32 when the integrated film thickness is larger than a threshold and the state of the level sensor 35 is in an OFF state. This may prevent the increase in the frequency of the supply of the liquid raw material to the raw material storage tank 32.

Further, the liquid raw material supply process of supplying the liquid raw material to the raw material storage tank 32 may be automated. Accordingly, the liquid raw material may be supplied to the raw material storage tank 32 without operator intervention.

The substrate processing apparatus has been described as a batch-type substrate processing apparatus in FIG. 1, but the present disclosure is not limited thereto. The substrate processing apparatus may be a single-wafer type substrate processing apparatus. The substrate processing apparatus may be a substrate processing apparatus that processes a substrate by using plasma. The substrate processing apparatus may be configured to form a film on a substrate through an atomic layer deposition (ALD) method, or may be configured to form a film on a substrate through a chemical vapor deposition (CVD) method, but the present disclosure is not limited thereto.

According to an aspect, it is possible to provide a liquid raw material supplying method and a gas supply apparatus which suppress variations in the film thickness of a film formed on a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of supplying a liquid raw material to a gas supply apparatus, wherein the gas supply apparatus includes:
   a storage tank configured to store the liquid raw material;
   a heater configured to heat the liquid raw material stored in the storage tank to generate a raw material gas;
   a level detector including a level measuring body that extends into the storage tank and configured to detect a liquid surface level of the liquid raw material stored in the storage tank in a longitudinal direction of the level measuring body, the liquid surface level of the liquid raw material indicating a height of the liquid raw material stored in the storage tank;
   a gas inlet provided in the storage tank and connected to a carrier gas supply that supplies a carrier gas to the storage tank, the carrier gas carrying the raw material gas;
   a gas outlet provided in the storage tank, and connected to a gas flow path that allows the raw material gas to flow out from the storage tank together with the carrier gas; and
   a raw material inlet provided in the storage tank, and connected to a liquid raw material supply that supplies the liquid raw material to the storage tank, and
   the method comprises:
   determining whether the liquid surface level of the liquid raw material detected by the level detector is equal to or lower than a supply target level; and
   repeating supply of a specified amount of the liquid raw material to the storage tank a specified number of times when the liquid surface level of the liquid raw material is equal to or lower than the supply target level.

2. The method according to claim 1, wherein the specified amount falls within a range of 0.1 to 10 times the raw material used for one film formation process.

3. The method according to claim 2, wherein the specified number of times falls within a range of 1 to 100 repetitions.

4. The method according to claim 1, wherein the liquid raw material contains at least one of aluminum (Al), hafnium (Hf), zirconium (Zr), titanium (Ti), and silicon (Si).

5. The method according to claim 1, wherein the repeating is started when an integrated thickness of a film formed on a substrate in a processing container through supply of the raw material gas from the gas supply apparatus to the processing container is equal to or greater than a threshold value, and the liquid surface level of the liquid raw material detected by the level detector is equal to or lower than the supply target level.

6. The method according to claim 5, wherein the threshold value is a value for determining whether to execute the supply of the liquid raw material into the storage tank.

7. The method according to claim 5, further comprising:
resetting the integrated thickness of the film formed on the substrate when the liquid surface level of the liquid raw material is higher than the supply target level.

8. The method according to claim 1, further comprising:
after the repeating supply of the specified amount of the liquid raw material, notifying that the liquid surface level of the liquid raw material has not reached the supply target level when the liquid surface level of the liquid raw material is equal to or lower than the supply target level.

9. A gas supply apparatus comprising:
a storage tank configured to store a liquid raw material;
a heater configured to heat the liquid raw material stored in the storage tank to generate a raw material gas;
a level detector including a level measuring body that extends into the storage tank and configured to detect a liquid surface level of the liquid raw material stored in the storage tank in a longitudinal direction of the level measuring body, the liquid surface level of the liquid raw material indicating a height of the liquid raw material stored in the storage tank;
a gas inlet provided in the storage tank, and connected to a carrier gas supply that supplies a carrier gas to the storage tank, the carrier gas carrying the raw material gas;
a gas outlet provided in the storage tank, and connected to a gas flow path that allows the raw material gas to flow out from the storage tank together with the carrier gas;
a raw material inlet provided in the storage tank, and connected to a liquid raw material supply that supplies the liquid raw material to the storage tank; and
a controller,
wherein the controller is configured to execute a process including:
determining whether the liquid surface level of the liquid raw material detected by the level detector is equal to or lower than a supply target level, and
repeating supply of a specified amount of liquid raw material to the storage tank a specified number of times when the liquid surface level of the liquid raw material is equal to or lower than the supply target level.

10. The gas supply apparatus according to claim 9, wherein the controller is configured to start the repeating, when an integrated thickness of a film formed on a substrate in a processing container through supply of the raw material gas from the gas supply apparatus to the processing container is equal to or greater than a threshold value, and the liquid surface level of the liquid raw material detected by the level detector is equal to or lower than the supply target level.

* * * * *